United States Patent [19]

Davidson

[11] Patent Number: 5,895,884
[45] Date of Patent: *Apr. 20, 1999

[54] SHIELDING DEVICE WITH PUSH FIT LID

[75] Inventor: Brian James Davidson, Surrey, United Kingdom

[73] Assignee: Nokia Mobile Phones, Ltd., Salo, Finland

[*] Notice: This patent issued on a continued prosecution application filed under 37 CFR 1.53(d), and is subject to the twenty year patent term provisions of 35 U.S.C. 154(a)(2).

[21] Appl. No.: 08/596,072

[22] Filed: Feb. 5, 1996

[30] Foreign Application Priority Data

Feb. 7, 1995 [GB] United Kingdom ............ 9502361

[51] Int. Cl.$^6$ ..................................................... H05K 9/00
[52] U.S. Cl. ..................................... 174/35 R; 220/4.02
[58] Field of Search ............................ 174/35 R, 52.1, 174/50, 51; 361/816, 818, 800; 220/4.02, 555

[56] References Cited

U.S. PATENT DOCUMENTS

| | | | |
|---|---|---|---|
| 3,234,318 | 2/1966 | Van Lieshout et al. | 174/35 MS |
| 3,909,726 | 9/1975 | Dobrovolny et al. | 325/357 |
| 4,816,613 | 3/1989 | Ito et al. | 174/35 R |
| 4,912,604 | 3/1990 | Vaisanen | 361/424 |
| 4,945,633 | 8/1990 | Hakanen et al. | 29/825 |
| 5,006,667 | 4/1991 | Lonka | 174/35 R |
| 5,175,395 | 12/1992 | Moore | 174/35 R |
| 5,271,056 | 12/1993 | Pesola et al. | 379/58 |
| 5,354,951 | 10/1994 | Lange, Sr. et al. | 174/35 R |
| 5,365,410 | 11/1994 | Lonka | 361/816 |
| 5,400,949 | 3/1995 | Hirvonen et al. | 228/180.22 |
| 5,442,521 | 8/1995 | Hirvonen et al. | 361/800 |
| 5,495,399 | 2/1996 | Gore et al. | 361/814 |
| 5,539,150 | 7/1996 | Kipka | 174/35 R |

FOREIGN PATENT DOCUMENTS

| | | |
|---|---|---|
| 0265285 A2 | 4/1988 | European Pat. Off. . |
| 0569281 | 5/1945 | United Kingdom . |
| 2029645 | 3/1980 | United Kingdom . |
| 2152291 | 7/1985 | United Kingdom . |
| 2156162 | 10/1985 | United Kingdom . |
| 2 285 181 | 6/1995 | United Kingdom . |
| WO 94/06268 | 2/1994 | WIPO . |

Primary Examiner—Kristine Kincaid
Assistant Examiner—Hung V. Ngo
Attorney, Agent, or Firm—Perman & Green, LLP

[57] ABSTRACT

A shielding device is formed from two unitary pieces, one of which pieces is a generally planar member taking the form of a lid and the other piece takes the form of a side wall member which is adapted for mounting to a substrate surface on which is mounted electric circuit elements. The two pieces together combine to create a shielding device for inhibiting the passage of electromagnetic radiation to and/or from a group of circuit elements disposed on a substrate. The lid may have flanges for connection onto the side wall member and the side wall member may have intersecting dividing walls disposed internally thereof.

10 Claims, 7 Drawing Sheets

SHIELDING DEVICE WITH PUSH FIT LID

BACKGROUND TO THE INVENTION

This invention relates to a shielding device for use in radio telephones, preferably for the shielding of electronic components on a circuit board.

Radio telephones are required by law to adhere to ElectroMagnetic Compatibility (EMC) limits as laid down in Type Approval Specifications for Mobile Phones. EMC is defined as the ability of a device to function properly in its intended electromagnetic environment and not to be a source of electromagnetic pollution to that environment.

To enable electronic apparatus to be electromagnetically compatible, electromagnetic (EM) shielding is often placed within the apparatus to reduce the radiation emissions from radiating sources and to reduce the levels of radiation reaching sensitive components.

In general, EM shields take the form of metal or metallised plastic covers designed to be placed over electronic components on a circuit board. To prevent the passage of radiation towards or away from the electronic components the shields are electrically grounded, typically using the grounding planes present on the circuit board. The most common way of attaching the shields to the circuit board and particularly to the grounding planes is by soldering. This provides a semi-permanent fixing that may only be removed by de-soldering.

Ordinarily, during the production of radio telephones the electronic components are firstly mounted onto the circuit board. EM shields are then placed over the components and secured using soldering techniques that may also provide electrical coupling to ground. The circuit board supporting the electronic components and the shield can then be tested. A percentage of circuit boards inevitably fail the tests and inspection and repair of the electronic components is usually required. Similarly, units which pass the tests and subsequently become faulty for any reason may also require inspection and repair.

Current soldered shield designs have a disadvantage in that the inspection and repair of soldered electronic components is blocked by the presence of the EM shield casings. To inspect and repair the electronic components the shields must be de-soldered, the inspection and repair carried out and then the shields must be re-soldered. De-soldering and re-soldering is laborious and creates a risk of damage to electronic components within the region of the shield.

Other known shielding devices such as U.S. Pat. No. 4,890,199 have the EM shield casing attached to the circuit board using one or more gaskets which allow removal of the shield casing during repair. These gaskets are, however, generally complex in structure and have to be mounted individually onto the circuit board during construction of the shield. Consequently manufacturing cost and time are increased using this method.

SUMMARY OF THE INVENTION

According to the invention there is provided a shielding device, for inhibiting the passage of electromagnetic radiation to and/or from a group of circuit elements disposed on a substrate, comprising a side wall member adapted for mounting on a substrate surface, and a push fit lid for removable attachment to the side wall member, such that removal of the lid allows access to circuit elements disposed on the substrate surface.

A shielding device in accordance with the invention has the advantage that removal and replacement of the shielding lid can be achieved both quickly and simply to allow access to the circuit elements. Substantial electromagnetic shielding is provided in the closed position, i.e. with the lid in place, and access to circuit elements beneath the shield is provided in the open position, i.e. with the lid removed. The action required to move the shielding device from the closed position to the open position does not involve de-soldering. Thus a simpler and less time-consuming solution is provided in circumstances where, for example, electronic components mounted on a circuit board beneath the shield require inspection and repair.

Another advantage given by a shielding device in accordance with the invention is that only two components, the lid and the side wall member, are required to make the shielding device. As a consequence a cheap solution is possible which requires less assembling time and is generally less complex. Preferably each of these components is formed from a unitary planar member.

A shielding device manufactured by folding two planar members has a number of advantages over other designs that use, for example, casting techniques. Firstly this type of manufacture is ideally suited to mass production methods where speed, consistency and low running costs are required. Secondly the design and production of the shield device in accordance with the invention can be easily modified to make shields of different shapes or sizes.

The shielding device is preferably made from a metal or a metal alloy, suitably, for example, nickel silver. This material provides good EM shielding and is suitable for folding. Also this material has a high degree of resistance to corrosion.

In a preferred embodiment two parts of the shielding device are respectively a side wall member and a lid with depending flanges. The flanges help to improve the shielding in the closed position. Also the flanges can be biased so that they are forced against and grip sections of the side walls. Projections disposed on the flanges produce increased force at the contact points with the side walls which results in a good electrical contact between the two shielding elements of the shielding device for good EM shielding. Complementing recesses which engage with the projections may be included on the side walls member of the shielding device which gives a method of fastening closed the push fit lid.

Internals walls may be included within the shielding device to provide shielded compartments. These compartments allow circuit elements on the substrate beneath the shield to be shielded from one another.

BRIEF DESCRIPTION OF THE DRAWINGS

Embodiments of the invention will now be described, by way of example, with reference to the accompanying drawings, in which.

DETAILED DESCRIPTION OF THE INVENTION

Figure 1:
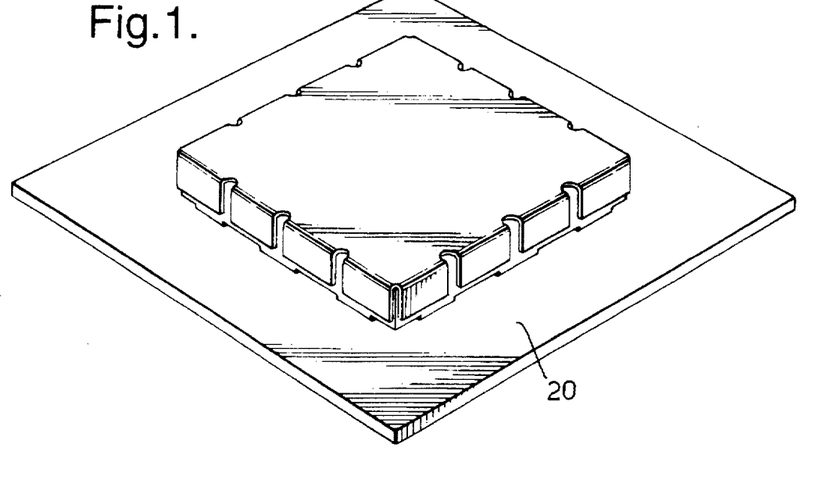
FIG. 1 is a diagram of a shielding device in accordance with the invention with the lid in place.
Figure 2:
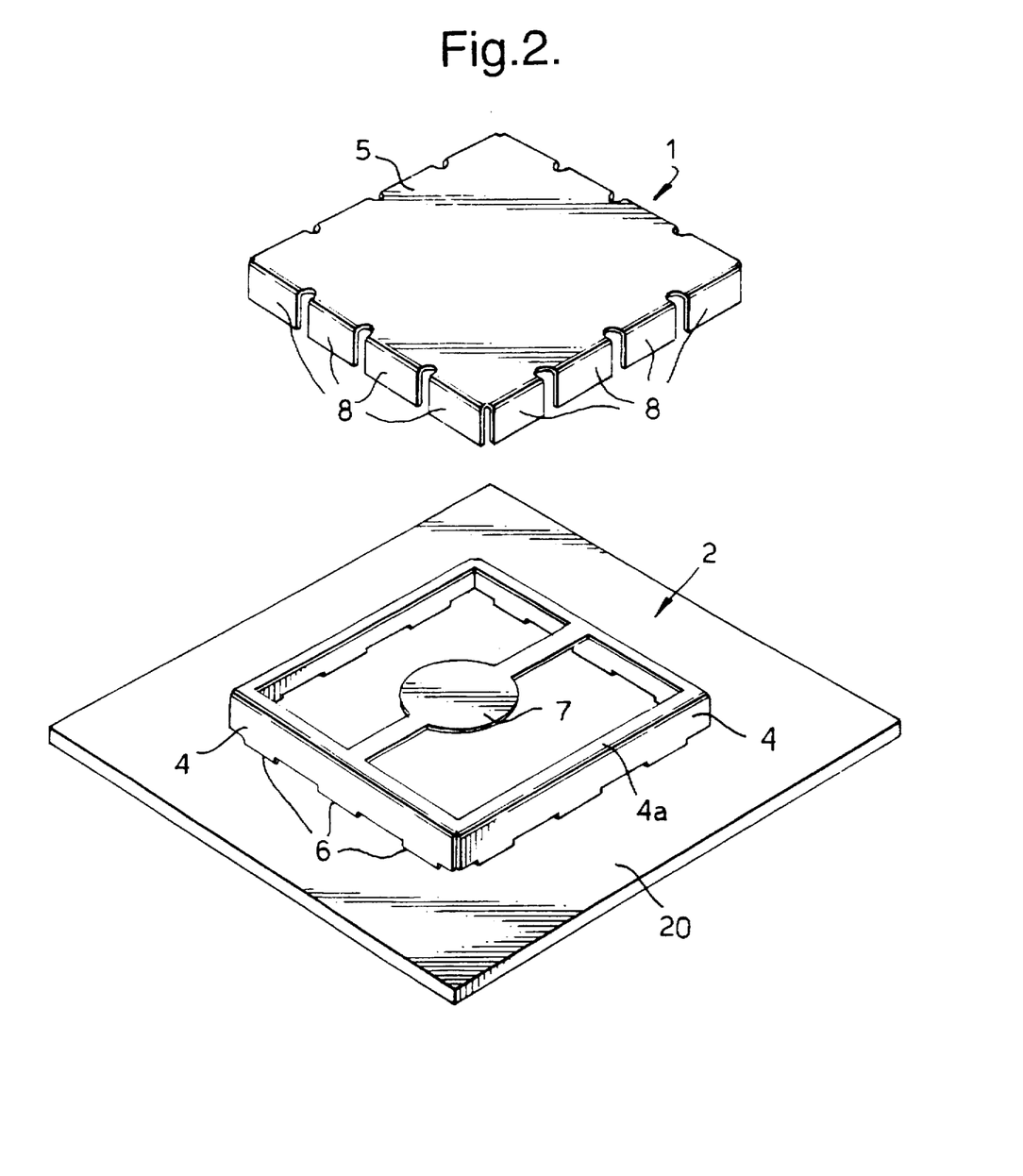
FIG. 2 is a diagram of the shielding device of FIG. 1 in accordance with the invention with the lid removed.

FIGS. 1 and 2 refer to a first embodiment of the invention whilst FIGS. 3 to 9 refer to a second embodiment of the invention.

Referring to FIG. 1 there is shown a shielding device in accordance with the invention mounted onto a substrate 20. The shielding device comprises two shielding elements, a push fit lid 1 and a side wall member 2, shown more clearly with the lid removed as in FIG. 2. With the lid 1 in place the shielding device resembles a standard shield in the form of a box for inhibiting the passage of radiation.

The side wall member 2 of the shielding device is designed to be mounted onto a substrate 20 as shown in FIGS. 1 and 2. Also included on the side wall member is a flat circular region 7 which is used to enable accurate placement of the shield onto the substrate by, for example, vacuum pick-and-place equipment. The lid 1 includes a top surface 5 and depending flanges 8 for contact with the side wall member 2. The side wall member 2 has side walls 4 with a lip 4a for support and to improve sealing at the intersection between the lid 1 and the side wall member 4. In the embodiment shown, the shielding device is provided with feet 6 which may be used as soldering points for soldering the side wall member 2 onto a grounding plane of the substrate 20.

Figure 3:
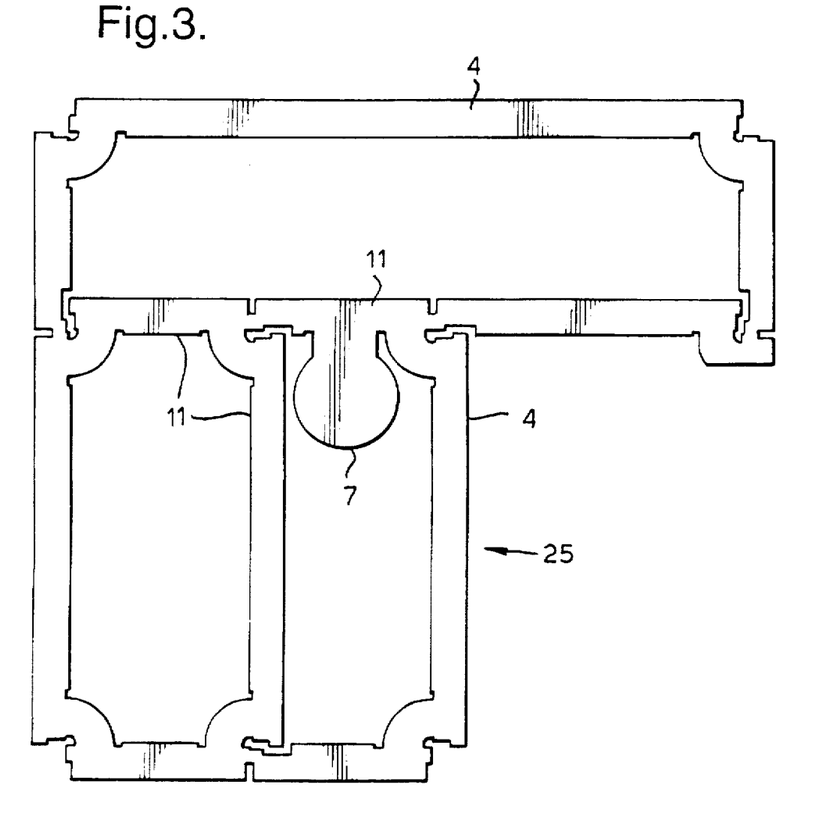
FIG. 3 is a diagram of a template for constructing the side wall member of a shielding device in accordance with the invention.
Figure 4:
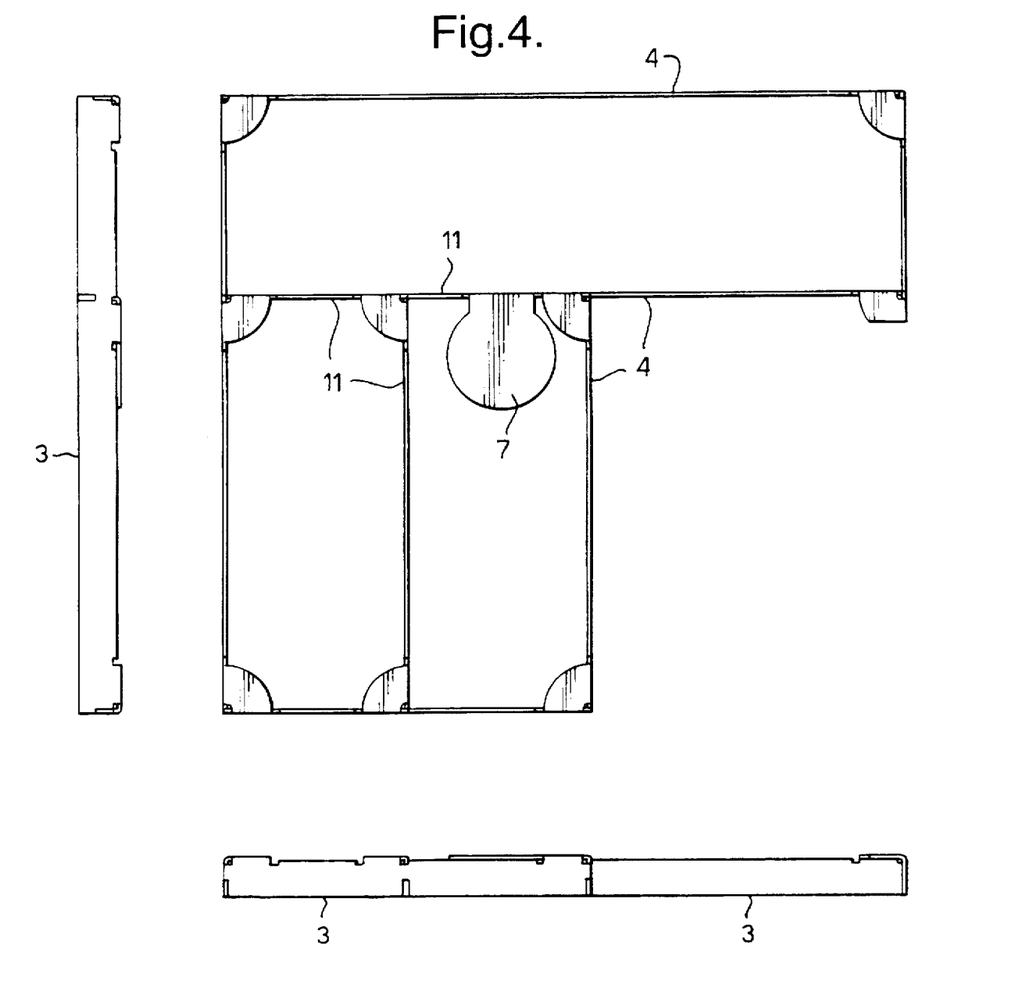
FIG. 4 is a diagram of the constructed side wall member of FIG. 3.

Referring now to a second embodiment, in which parts similar to that of the first embodiment are referenced by the same reference numerals. FIG. 3 shows a template 25 cut from a planar sheet such as, for example, sheet metal. By bending the template 25 along predetermined lines, the side wall member of the shielding device is constructed as shown in FIG. 4. The side wall member of this embodiment has flat lower edges 3 in preference to the feet 6 used in the first embodiment. Therefore, mounting of the sidewall member to a substrate can be achieved by seam soldering the lower edge 3 to the substrate.

Figure 5:
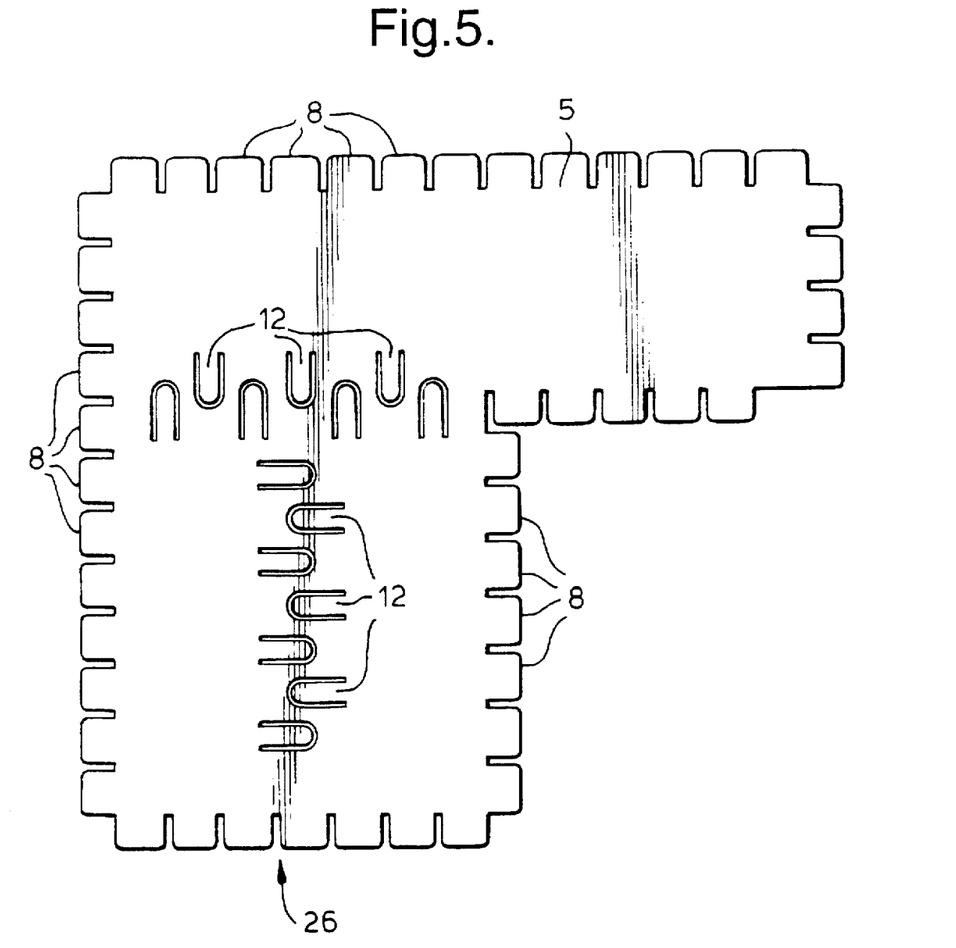
FIG. 5 is a diagram of a template for constructing the push fit lid of a shielding device in accordance with the invention.
Figure 6A:
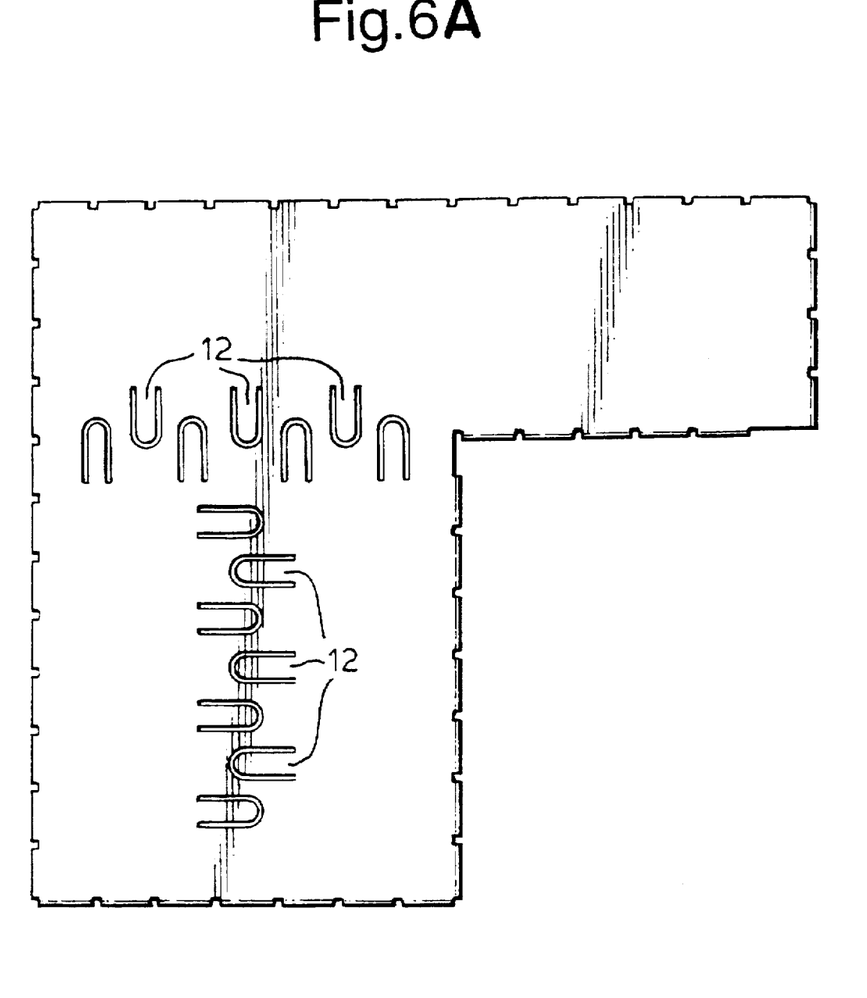
FIG. 6 is a diagram of the constructed push fit lid of FIG. 5.
Figure 6B:
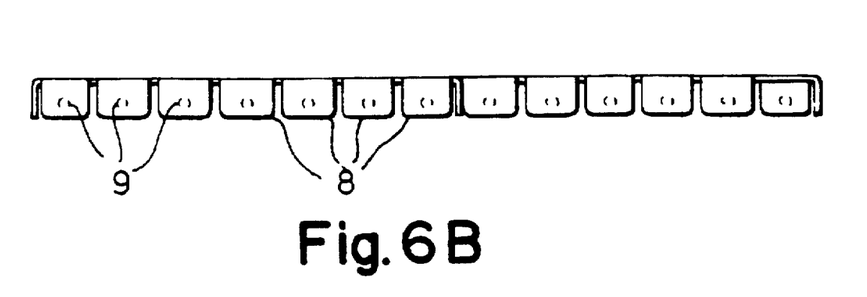
Figure 7:
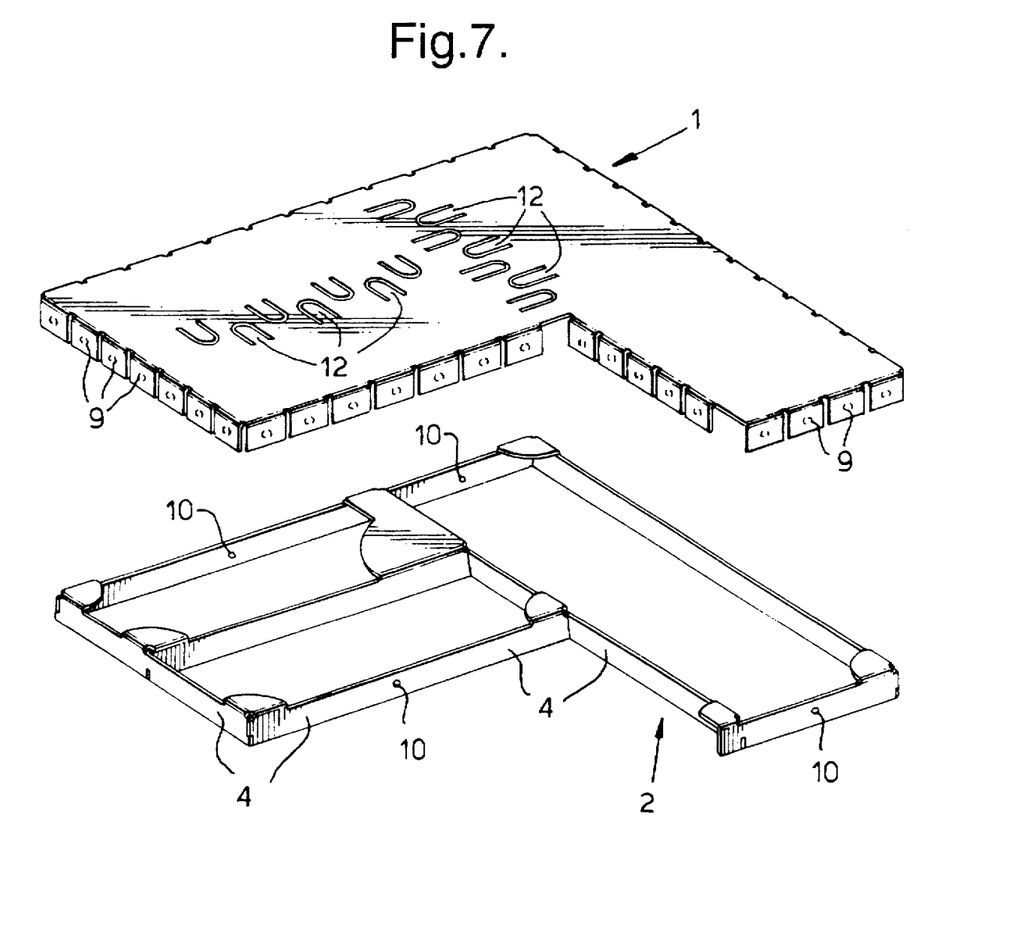
FIG. 7 is a diagram of the shielding device of FIGS. 4 and 6 in a perspective view
Figure 8:
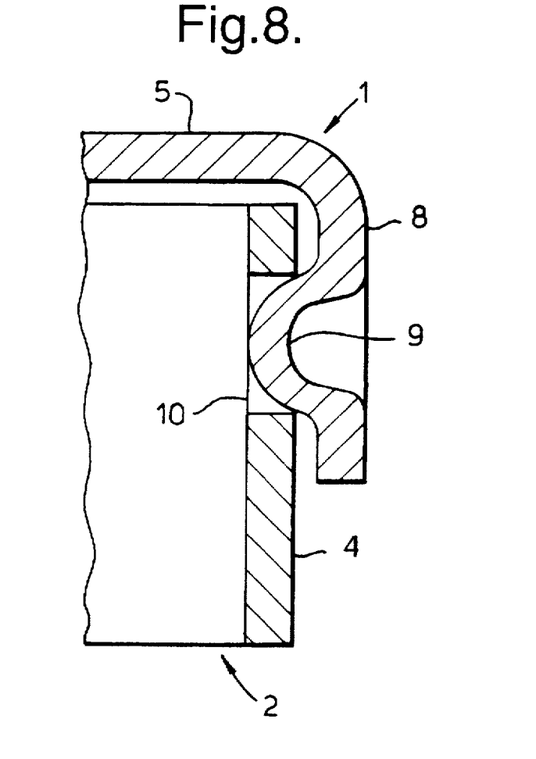
FIG. 8 is a cross-sectional view of the edge of the shielding device of FIG. 7 with the push fit lid and the side wall member connected.

Referring to FIG. 5 there is shown a template 26 cut from a planar sheet such as, for example, sheet metal. By bending the template 26 along predetermined lines, a push fit lid of the shielding device is constructed as shown in FIG. 6A and 6B.

The push fit lid 1 of the shielding device has flanges 8 which extend from its outer edges. These flanges 8 depend from the lid 1 so that they point generally downwards. The flanges can be biased for contact with the outside surface of side walls 4 of the side wall member so that the push fit lid grips the side wall member when the lid is in place. This improves the electrical contact between the two shielding elements.

The surfaces of the flanges that contact the side walls 4 are, in this embodiment, provided with dome shaped projections 9 which may be formed using a metal punch. With the push fit lid fully in place the projections 9 abut the outside surfaces of the side walls 4. The biasing action of the flanges helps the projections to maintain an increased force on the side walls thus providing a further gripping action and a good electrical contact between the two shielding elements in the closed position.

The side wall member 2 includes apertures 10 cut out of the side walls. These apertures 10 are positioned to complement the projections 9. When the shielding device is in the closed position, i.e with the lid in place, the projections are urged into the holes by the biasing of the flanges 8. Consequently the projections mate with the holes to retain the shielding device in the closed position.

To gain access to electrical components on the substrate surface 20, the push fit lid must be removed from the side wall member. The process of removing the push fit lid may be performed manually by urging the lid upwards away from the side wall member. Optionally, however, the lid 5 may be provided with an aperture or other means by which a tool can be used to lift it from the closed position.

Figure 9:
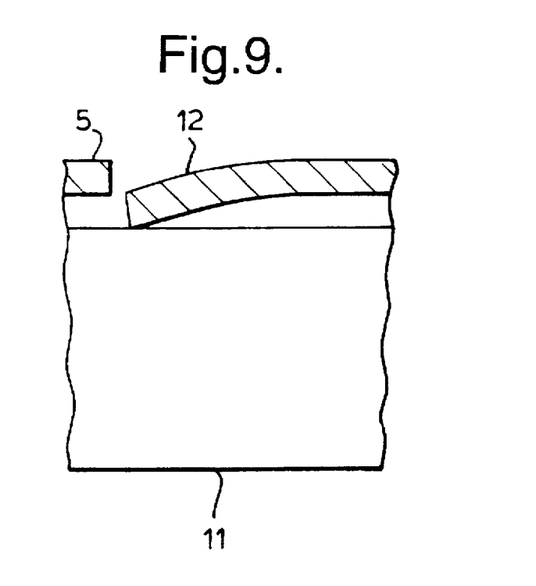
FIG. 9 is across-sectional view of the top of the shielding device of FIG. 7 with the push fit lid and the side wall member connected.

In this embodiment the side wall member includes internal dividing walls 11 spanning between the side walls. These provide additional shielded compartments within the shielding device as shown in FIG. 4. To achieve improved shielding between compartments, the internal walls can also be connected to ground via grounding planes on the substrate preferably by seam soldering. The internal walls are also high enough to reach and provide electrical contact with the push fit lid. This electrical contact is maximised by sprung fingers 12 dependent from the push fit lid. These sprung fingers 12 are biased towards the internal walls as shown in FIG. 9 to give a good electrical contact between the internal walls and the push fit lid.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

What is claimed is:

1. A shielding device for inhibiting the passage of electromagnetic radiation to and from a group of circuit elements disposed on a substrate surface comprising:

a side wall member adapted for mounting on the substrate surface, wherein said side wall member is a unitary member constructed from a single planar sheet, said side wall member comprising a plurality of side walls wherein selective bending of pre-defined discrete areas of the planar sheet along respective axes forms adjacent side walls, and a push fit lid for removable attachment to the side wall member, such that removal of the lid allows access to the circuit elements disposed on the substrate surface, and wherein said side wall member further comprises an internal wall defining compartments separated from each other by said internal wall, said internal wall being formed by the selective bending of pre-defined areas of the planar sheet.

2. A shielding device as claimed in claim 1 wherein said side wall member further comprises complementary interlocking apertures and projections for mechanically coupling respective walls of said side wall member.

3. A shielding device as claimed in claim 1 wherein the push fit is enabled by a plurality of flanges depending from the push fit lid.

4. A shielding device as claimed in claim 3 wherein at least one of the plurality of flanges is arranged for disposition outside the side wall member.

5. A shielding device as claimed in claim 3 wherein at least one of the plurality of flanges is biased for contact with the side wall member.

6. A shielding device as claimed in claim 3 wherein at least one of the plurality of flanges includes a projection extending towards a contact surface of the side wall member for improved electrical conduction between the side wall member and the lid.

7. A shielding device as claimed in claim 6 wherein the side wall member comprises a recess for accommodating said projection of said at least one of the plurality of flanges in the closed position.

8. A shielding device as claimed in claim 7 wherein the recess is an aperture.

9. A shielding device as claimed in claim 1 wherein the lid includes sprung fingers for providing electrical contact between the lid and the internal wall.

10. A shielding device as claimed in claim 1 wherein the shielding device is made from a metal or a metal alloy.

* * * * *